(12) United States Patent
Fuma et al.

(10) Patent No.: US 7,847,604 B2
(45) Date of Patent: Dec. 7, 2010

(54) DRIVING CIRCUIT FOR POWER SEMICONDUCTOR ELEMENT INCLUDING CONTROLLING CIRCUIT THAT PROVIDES CONTROL WHEN DETECTED VOLTAGE REACHES PREDETERMINED VOLTAGE

(75) Inventors: Hiroo Fuma, Gifu (JP); Hiromichi Kuno, Nishikamo-gun (JP); Satoshi Hirose, Nishikamo-gun (JP); Naoyoshi Takamatsu, Susono (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 54 days.

(21) Appl. No.: 12/442,029

(22) PCT Filed: Jan. 17, 2008

(86) PCT No.: PCT/JP2008/050930

§ 371 (c)(1),
(2), (4) Date: Mar. 19, 2009

(87) PCT Pub. No.: WO2008/088075

PCT Pub. Date: Jul. 24, 2008

(65) Prior Publication Data

US 2010/0019808 A1    Jan. 28, 2010

(30) Foreign Application Priority Data

Jan. 18, 2007    (JP) .............................. 2007-009299

(51) Int. Cl.
*H03K 3/00* (2006.01)
(52) U.S. Cl. ....................................... 327/108; 327/112
(58) Field of Classification Search .......... 327/108–112
See application file for complete search history.

(56) References Cited

U.S. PATENT DOCUMENTS

| 5,986,484 | A | 11/1999 | Kimata |
| 6,917,226 | B2* | 7/2005 | Brown ......................... 327/110 |
| 7,365,584 | B2* | 4/2008 | Bennett et al. .............. 327/170 |
| 7,746,123 | B2* | 6/2010 | Hester et al. ................ 327/108 |

FOREIGN PATENT DOCUMENTS

| JP | 05-328746 A | 12/1993 |
| JP | 06-291631 A | 10/1994 |
| JP | 08-172769 A | 7/1996 |

(Continued)

*Primary Examiner*—Kenneth B. Wells
(74) *Attorney, Agent, or Firm*—Sughrue Mion, PLLC

(57) ABSTRACT

Provided is a driving circuit which suppresses a surge voltage at the time of switching a power semiconductor element and reduces switching loss. An element (10) such as an IGBT and another element (20) to be paired are connected, the element (10) is driven by a driver (22), and a gate voltage is controlled by a control circuit (24). When the power semiconductor element is turned off, a comparator (26) detects that a voltage (Vak) of the element (20) is a prescribed voltage, the control circuit (24) switches gate resistance from low resistance to high resistance to suppress the surge voltage, and the switching loss is reduced. When the power semiconductor element is turned on, start up of the voltage (Vak) is detected, and the control circuit (24) switches the gate resistance from high resistance to low resistance after a prescribed time to suppress the surge voltage, and the switching loss is reduced.

9 Claims, 6 Drawing Sheets

FOREIGN PATENT DOCUMENTS

| | | |
|---|---|---|
| JP | 10-023743 A | 1/1998 |
| JP | 10-075164 A | 3/1998 |
| JP | 3141613 B2 | 12/2000 |
| JP | 2001-197724 A | 7/2001 |
| JP | 2004-253582 A | 9/2004 |
| JP | 2004-266368 A | 9/2004 |

* cited by examiner (a)

(b)

DRIVING CIRCUIT FOR POWER SEMICONDUCTOR ELEMENT INCLUDING CONTROLLING CIRCUIT THAT PROVIDES CONTROL WHEN DETECTED VOLTAGE REACHES PREDETERMINED VOLTAGE

TECHNICAL FIELD

The present invention relates to a driving circuit of a semiconductor element, and in particular, to reduction in surge voltage and in switching loss in a semiconductor element for power.

BACKGROUND ART

In a power circuit, a semiconductor switching element is used, and reductions in surge voltage during switching and in switching loss are important subjects. In the related art, methods are proposed in which gate voltage during switching of the semiconductor switching element is actively controlled so that switching loss is reduced while the surge voltage is maintained at a low level. In these methods, an element voltage, an element current, and a gate voltage of the switching element to be driven are detected, and a logic process is applied by a single detection signal or combination of detection signals, to control the gate voltage. The gate voltage is controlled by changing the voltage of the gate circuit or changing the gate resistance. Japanese Patent No. 3141613 and JP 2001-197724 A exemplify semiconductor switching elements.

However, when the element current is to be detected, flux-concentration type magnetic current sensors have problems in that they are costly and the sensor size is large. Hall magnetic sensors and single magnetic resistance elements have inferior precision and are also costly. In addition, as the current value to be used for the control, a value immediately before the switching is necessary, and thus high speed detection is required. However, it is difficult to achieve both precision and high speed detection at the same time.

In addition, when the gate voltage is to be detected, there also are problems in that the gate voltage shows complex behaviors because feedback is applied from a parasitic capacitance of the driving element during switching, and that switching noise from other circuits connected to the same ground line tends to mix because the power supply is approximately 15V. In addition, because a change point of the gate voltage becomes a branch point in the circuit operation, a circuit operation monitor signal is detected by a differential the voltage. However, because the voltage differential signal has a small value, a large control error is caused by other noise, and thus the voltage differential signal is unsuited as a control signal during switching.

On the other hand, although detection of the element voltage is relatively easy because the element voltage has a large value, the controlling point of the gate voltage must be optimized. In the above-described Patent References 1 and 2 also, the element voltage is used. However, in Patent Reference 1, there is no disclosure of the detection point and, in Patent Reference 2, a point in which the element voltage is low is set as the detection point and there is a problem in that variation of elements cannot be handled.

DISCLOSURE OF INVENTION

The present invention provides a driving circuit which can reduce surge voltage and switching loss during switching of a semiconductor element for power.

According to one aspect of the present invention, there is provided a driving circuit of a semiconductor element for power, comprising a second semiconductor element which is connected in series to and forms a pair with a first semiconductor element which is a constituent element in each arm of a motor-driven inverter, and which is to be driven, wherein the first semiconductor element and the second semiconductor element are driven by supplying a power supply voltage Vb to the first semiconductor element and the second semiconductor element, the driving circuit comprising a controlling circuit which controls, in a switching manner, at least one of a gate resistance, an applied voltage on a gate, and a gate input capacitance of the first semiconductor element during an OFF operation of the first semiconductor element, and a detecting circuit which detects a voltage Vak of the second semiconductor element, wherein the controlling circuit controls, in a switching manner, at least one of the gate resistance, the applied voltage on the gate, and the gate input capacitance at a time after a first predetermined time has elapsed from a time when the voltage Vak detected by the detecting circuit reaches a first predetermined voltage $\Delta V1$.

According to another aspect of the present invention, there is provided a driving circuit of a semiconductor element for power, comprising a second semiconductor element which is connected in series to and forms a pair with a first semiconductor element which is to be driven, wherein the first semiconductor element and the second semiconductor element are driven by supplying a power supply voltage Vb to the first semiconductor element and the second semiconductor element, the driving circuit comprising a controlling circuit which controls, in a switching manner, at least one of a gate resistance, an applied voltage on a gate, and a gate input capacitance of the first semiconductor element during an ON operation of the first semiconductor element, and a detecting circuit which detects a voltage Vak of the second semiconductor element, wherein the controlling circuit controls, in a switching manner, at least one of the gate resistance, the applied voltage on the gate, and the gate input capacitance at a time after a second predetermined time has elapsed from a time when the voltage Vak detected by the detecting circuit reaches a second predetermined voltage $\Delta V2$.

According to another aspect of the present invention, there is provided a driving circuit of a semiconductor element for power, comprising a second semiconductor element which is connected in series to and forms a pair with a first semiconductor element which is to be driven, wherein the first semiconductor element and the second semiconductor element are driven by supplying a power supply voltage Vb to the first semiconductor element and the second semiconductor element, the driving circuit comprising a controlling circuit which controls, in a switching manner, at least one of a gate resistance, an applied voltage on a gate, and a gate input capacitance of the first semiconductor element during an ON operation of the first semiconductor element, and a detecting circuit which detects a gate voltage during the ON operation of the first semiconductor element, wherein the controlling circuit controls, in a switching manner, at least one of the gate resistance, the applied voltage on the gate, and the gate input capacitance at a time after a third predetermined time has elapsed from a time when the detected gate voltage reaches a voltage which is greater than or equal to a third predetermined voltage $\Delta V3$ which is less than or equal to a threshold voltage.

According to another aspect of the present invention, there is provided a driving circuit of a semiconductor element for power, comprising a second semiconductor element which is connected in series to and forms a pair with a first semiconductor element which is to be driven, wherein the first semiconductor element and the second semiconductor element are driven by supplying a power supply voltage Vb to the first semiconductor element and the second semiconductor element, the driving circuit comprising a controlling circuit which controls, in a switching manner, at least one of a gate resistance, an applied voltage on a gate, and a gate input capacitance of the first semiconductor element during an OFF operation and during an ON operation of the first semiconductor element, and a detecting circuit which detects a voltage Vak of the second semiconductor element, wherein the controlling circuit controls, in a switching manner, at least one of the gate resistance, the applied voltage on the gate, and the gate input capacitance during the OFF operation at a time after a first predetermined time has elapsed from a time when the voltage Vak detected by the detecting circuit reaches a first predetermined voltage ΔV1, and controls, in a switching manner, at least one of the gate resistance, the applied voltage on the gate, and the gate input capacitance during the ON operation at a time after a second predetermined time has elapsed from a time when the voltage Vak detected by the detecting circuit reaches a second predetermined voltage ΔV2.

According to various aspects of the present invention, it is possible to inhibit surge voltage and reduce switching loss during turn-off or turn-on with a high precision, even with a simple structure.

The present invention will more clearly be understood with reference to the following description of the embodiment. The embodiment, however, is merely exemplary, and the scope of the present invention is not limited to the embodiment.

BRIEF DESCRIPTION OF DRAWINGS

FIG. 7 is a diagram for explaining a change with respect to time of Vce during turn-on.
FIG. 9 is a diagram for explaining a change with respect to time of Vak of the fixed gate resistance during turn-on.
FIG. 10 is a diagram for explaining a change with respect to time of Vak of the active gate during turn-on.
FIG. 11 is a diagram for explaining a change with respect to time of Vce of the fixed gate resistance during turn-on.
FIG. 12 is a diagram for explaining a change with respect to time of Vce of the active gate during turn-on.

BEST MODE FOR CARRYING OUT THE INVENTION

A preferred embodiment of the present invention will now be described in detail with reference to the drawings.

<Turn-Off>

Figure 1A:
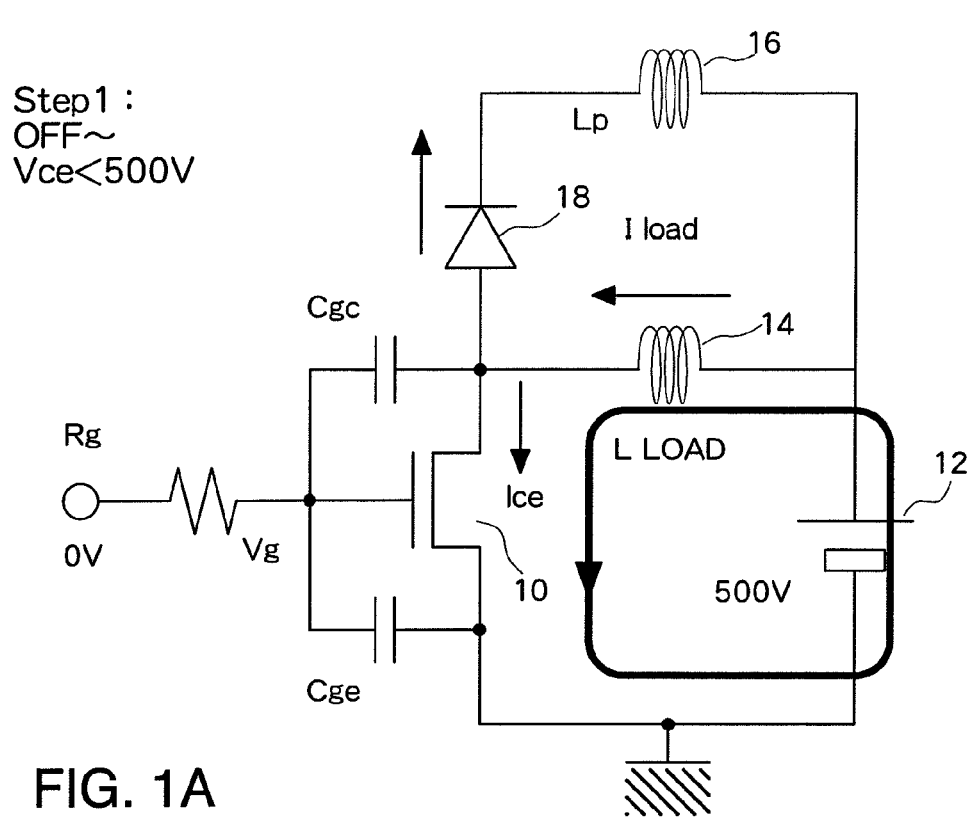
FIG. 1A and FIG. 1B are diagrams for explaining the occurrence of surge voltage during turn-off.
Figure 1B:
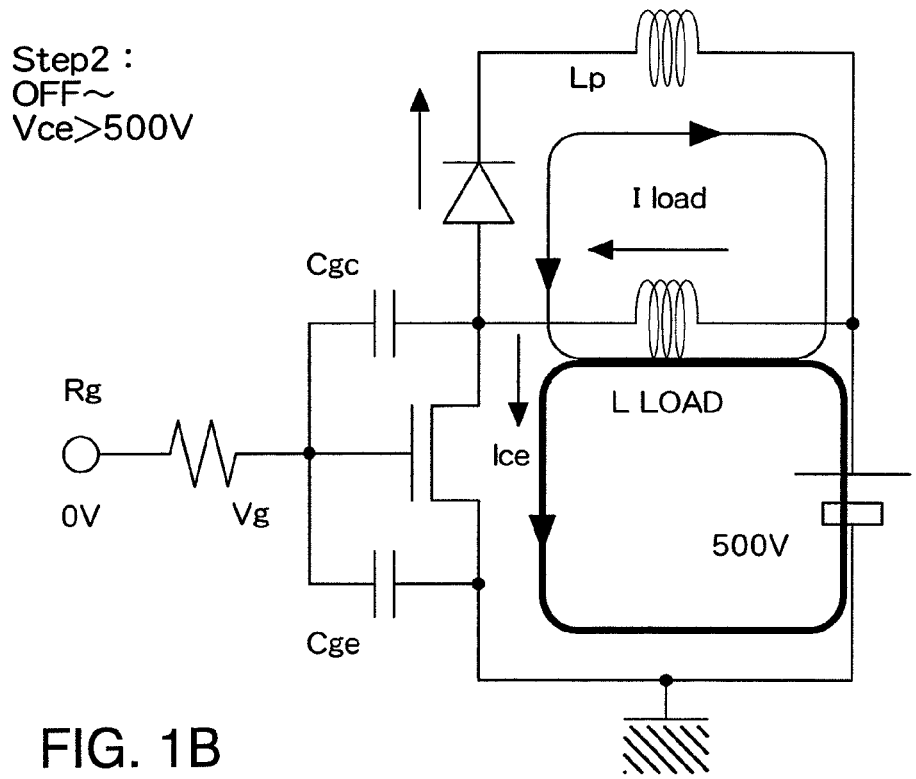

A turn-off during drive of an inductance load (L) using a MOSFET or an IGBT as a semiconductor element for power (power semiconductor) will first be described. FIG. 1A and FIG. 1B show a circuit structure. An element 10 to be driven and a diode 18 are connected in series to a power supply 12. An inductance load (L) 14 is connected between a connecting point between the element 10 to be driven and the diode 18 and the power supply 12. In a case of a large load L, as shown in step 1 of FIG. 1A, the same element current Ice continues to flow even when a gate voltage Vg of the element 10 to be driven is set to an OFF level. When the element voltage of the element 10 to be driven exceeds the power supply voltage of the power supply 12 (500 V in FIG. 1), as shown in step 2 in FIG. 1B, current starts to flow in the diode 18 which is connected in series, and the element current Ice starts to be reduced. However, because a current also flows in a parasitic inductance 16 which is present in series with the diode 18, a surge voltage corresponding to the change in current occurs in the parasitic inductance 16.

Because step 1 of FIG. 1A and step 2 of FIG. 1B are basically independent of each other, in step 1, the gate voltage Vg may be controlled to be optimum for step 1 and, in step 2, the gate voltage Vg may be controlled to be optimum for step 2. Therefore, the gate voltage Vg is desirably controlled in a switching manner at a boundary between step 1 and step 2. The boundary between step 1 and step 2 is the time when the element voltage Vce reaches the power supply voltage Vb, that is, a time where Vce=Vb. In order to control in a switching manner at this time, however, it is necessary to set a detection point at a time earlier than the time when Vce=Vb by a control response time.

When the detection point is to be set using the element voltage Vce, if the detection is to be executed at a low-voltage side, because of the situation at that time, such as an element temperature or current and a characteristic variation among elements, the time from the detection point (for example, 50 V on the low-voltage side) to the switching point for the gate voltage control (Vce=Vb) would significantly vary. Because of this, if a detection point is set on the low-voltage side and the gate voltage control is to be switched after a predetermined time has elapsed, the switching of control would occur at a point which is significantly deviated from the optimum switching point where Vce=Vb, and thus the switching loss cannot be reduced, and at the same time, the surge voltage cannot be reduced according to the control target, resulting in possible characteristic degradation of the element or possible element breakdown. When, on the other hand, the detection is to be executed on a high-voltage side of the element voltage Vce, the temporal error from the detection point to the control switching point is smaller, and thus it is possible to inhibit the variation within a tolerable limit. The detection point on the high-voltage side may be set in consideration of the control response time of the gate voltage controlling circuit, and the detection point may be set at a voltage satisfying the following condition:

$$Vce = Vb - \Delta V1 \tag{1}$$

Here, ΔV1 is a value determined depending on each circuit, based on a delay time (delay) of the gate voltage controlling circuit, and is set, for example, to 150 V. By detecting that Vce has reached Vce=Vb−ΔV1 and starting the switching of the control of the gate voltage at this point, it is possible to realize switching control of the gate voltage at an optimum time because the Vce would reach Vb after the control response time has elapsed.

Figure 2:
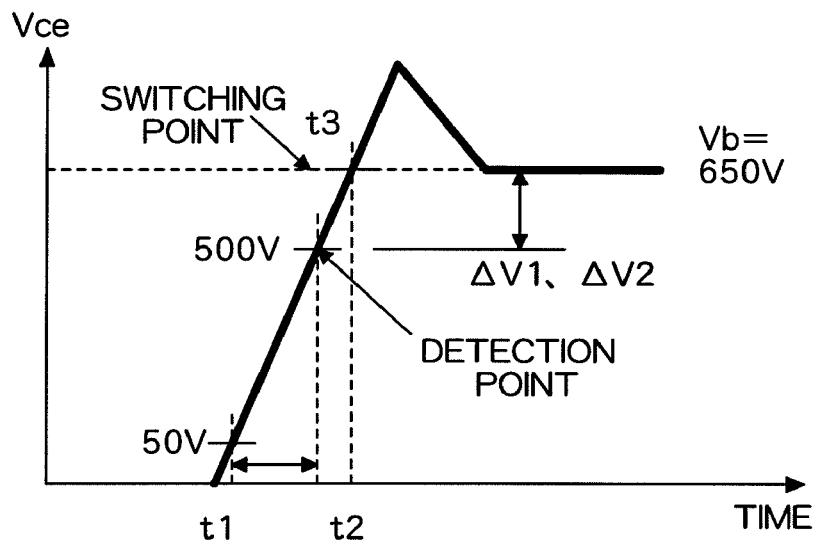
FIG. 2 is a diagram for explaining a detection point during turn-off.
Figure 3:
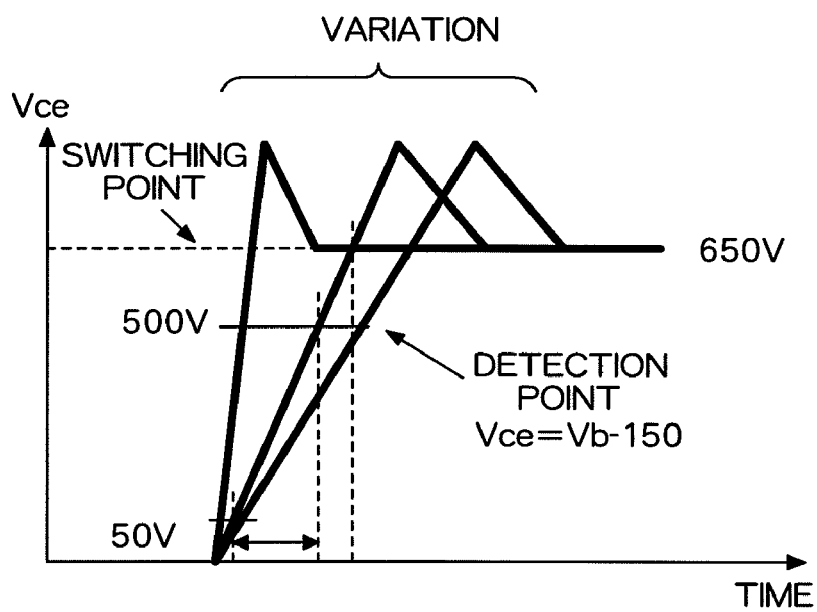
FIG. 3 is a diagram for explaining a variation in elements during turn-off.

FIGS. 2 and 3 show a change with respect to time of Vce during turn-off. At time t1, the element is turned off, and the element voltage Vce continues to be increased in the time period of t1 to t3 and reaches the power supply voltage Vb at time t3 (which corresponds to step 1 of FIG. 1A). After the time t3, the surge voltage occurs due to the parasitic inductance 16 (which corresponds to step 2 of FIG. 1B). The gate voltage control may be switched when Vce reaches Vb (Vb=650 V in the drawings). If the switching control is started when Vce reaches a voltage at the low-voltage side such as, for example, 50 V, when there is a variation in the rising characteristic of Vce due to the variation in the element characteristic as shown in FIG. 3, the surge voltage cannot be inhibited in certain elements because the start-up is fast and the switching loss is increased in other elements because the start-up is slow, even if the switching of the control is started at the time when Vce reaches 50V. In consideration of this, as shown in FIG. 2, a voltage of Vb−ΔV1 which is lower than Vb by a predetermined voltage ΔV1 (for example, when Vb=650 V and ΔV1=150 V, Vb−ΔV1=500 V) is set as the detection point at the high-voltage side, and the switching of the gate voltage control is started at this point. In this configuration, even if there is a variation in the element characteristic and the start-up time of Vce differs (even if a slope of change with respect to time of Vce differs), as shown in FIG. 3, the variation in time from the time when Vce=500 V to the time when Vce=650 V can be suppressed at a low level. For example, when the detection point is set at 50 V, the temporal variation from the detection point to the switching point (a time where Vce=Vb) is around 86 ns to 275 ns, while the temporal variation from the detection point to the switching point can be suppressed to around 17 ns to 55 ns when the detection point is set at 500 V.

When the detection point is set using Vce=Vb−ΔV1, however, the detection point would change corresponding to a change in the power supply voltage (battery voltage) Vb. In particular, because the battery voltage of a hybrid vehicle changes significantly, it is not possible to set an optimum detection point by monitoring Vce and setting, as the detection point, a point where Vce reaches Vb−ΔV1.

Figure 4:
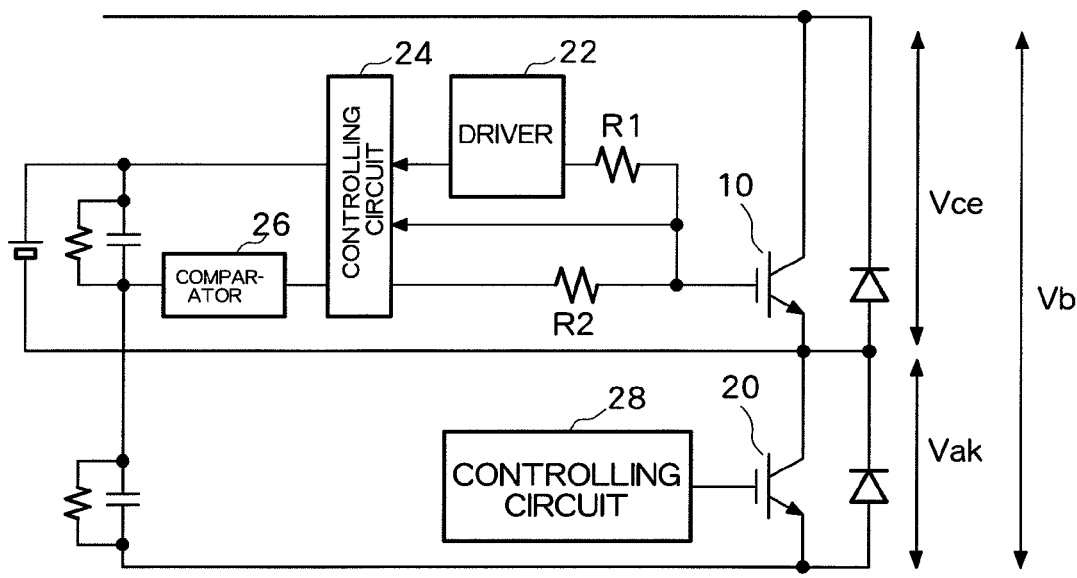
FIG. 4 is a circuit structure diagram when an upper-side element is driven.

On the other hand, when a structure as shown in FIG. 4 is employed in which an element 20 which forms a pair with the element 10 to be driven is connected in series with the element 10 to be driven, the gate voltage of the element 10 is controlled by a driver 22 and a controlling circuit 24, the gate voltage of the element 20 is controlled by a controlling circuit 28, the power supply voltage Vb is applied to the elements 10 and 20, and an element voltage Vak of the element 20 is detected by a comparator 26, the following relationship can be obtained.

$$Vb = Vce + Vak \quad (2)$$

The equation Vce=Vb−ΔV1 can be rewritten using the equation (2) into the following form.

$$Vak = Vb - Vce \, \Delta V1 \quad (3)$$

This indicates that, when the element voltage Vak of the element 20 which forms a pair with the element 10 to be driven is detected in a structure as shown in FIG. 4, even if the power supply voltage Vb changes, the time when Vb−ΔV1, which is the detection point, can always be detected by detecting Vak=ΔV1, and a reference detection point which is independent from the change in Vb, can be set by detecting a time where Vak reaches ΔV1. In this manner, in the present embodiment, Vb−ΔV1 on the high-voltage side is set as the detection point, and the element voltage Vak of the element 20 which forms a pair with the element 10 to be driven, rather than Vce, is set as the detection target, and the time where Vak becomes ΔV1 is set as the detection point, so that the gate voltage control can be reliably switched at a point where Vce=Vb independent from the element variation and independent from the change in Vb.

The switching of the gate voltage control may be executed, for example, by switching the gate resistance. In step 1 of FIG. 1A, that is, in a period from start-up of Vce to the time when Vce reaches Vb, the gate resistance is set to a small value in order to quickly start up the voltage and reduce the switching loss. In step 2 of FIG. 1B, that is, in a period where the surge voltage occurs after Vce reaches Vb, the gate resistance is set to a large value in order to reduce the surge voltage.

Figure 5:
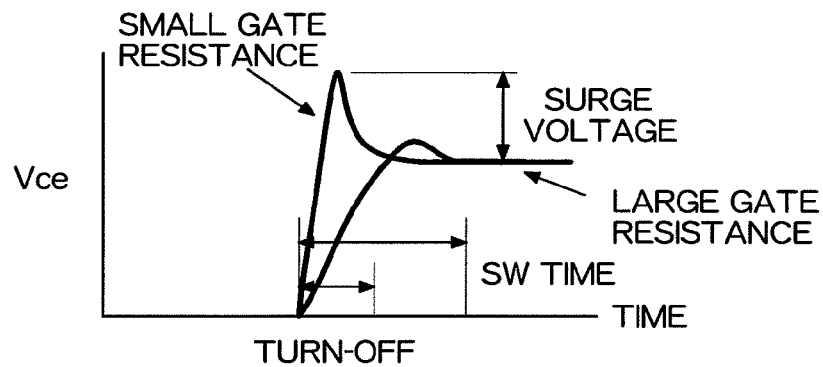
FIG. 5 is a diagram for explaining a change with respect to time of Vce of a fixed gate resistance during turn-off.
Figure 6:
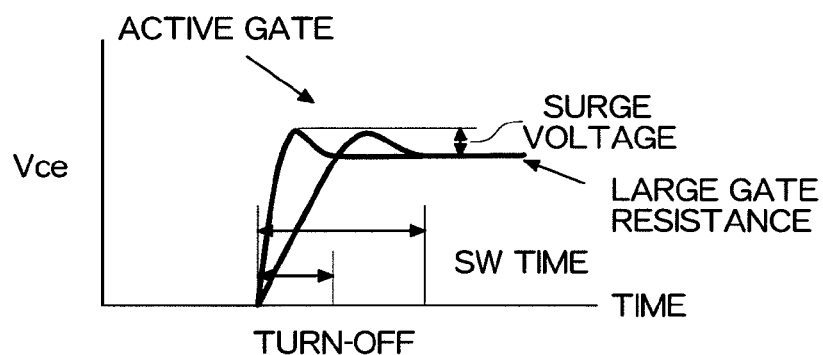
FIG. 6 is a diagram for explaining a change with respect to time of Vce of an active gate during turn-off.

FIG. 5 shows a change with respect to time of the element voltage Vce during turn-off when the gate resistance of the element 10 to be driven is fixed to a relatively large resistance and to a relatively small resistance. When the gate resistance is small, the element voltage Vce starts up steeply during turn-off and the surge voltage occurs. When, on the other hand, the gate resistance is large, although the surge voltage during turn-off can be suppressed, the start-up of the element voltage Vce is slow and switching loss occurs. FIG. 6 shows a change with respect to time of the element voltage Vce when an active gate is employed as in the present embodiment in which the gate resistance is switched when the element voltage Vak of the element 20 forming a pair with the element 10 to be driven reaches ΔV1. A change with respect to time is shown in which the case of the relatively large gate resistance and the case of the relatively small gate resistance shown in FIG. 5 are combined. More specifically, because the gate resistance is relatively small from the time of turn-off to a time when Vak reaches ΔV1, the element voltage Vce starts up steeply. When Vak reaches ΔV1, the gate resistance is relatively increased, and the surge voltage is suppressed. By applying a control to switch the gate resistance by monitoring the element voltage Vak of the element 20 which forms a pair with the element 10 to be driven in place of the element voltage Vce, and using the fact that the element voltage Vak has reached ΔV1 as a trigger as described above, it is possible to reduce the switching loss while suppressing the surge voltage.

The control during turn-off will now be described in more detail with reference to FIG. 4. In the structure of FIG. 4, an upper-side element driving circuit and a lower-side element driving circuit have different structures, and when Vak of the lower-side element is detected with the upper-side element driving circuit, Vak can be easily detected by a voltage dividing circuit having a capacitor and a resistor.

The element voltage Vak which is voltage-divided is compared to a reference voltage ΔV1 in a comparator 26. In a hybrid vehicle (HV) driven with 650V, ΔV1 is approximately 150V. When it is detected by the comparator 26 that Vak has reached 150 V, a detection signal is supplied to a controlling circuit 24. The controlling circuit 24 switches the gate resistance from a relatively small resistance to a relatively large resistance after 30 ns to 50 ns has elapsed from detection. The gate resistance comprises a resistor R1 having a relatively large resistance and a resistor R2 having a relatively small resistance. The gate resistance is formed with the resistors R1 and R2 until Vak reaches ΔV1, and when Vak reaches ΔV1, the resistor R2 is separated from the circuit and is switched off, so that the gate resistance is increased. The timing of 30 ns to 50 ns corresponds to the time period from the time when Vce=Vb−150 V to the time when Vce=Vb, and therefore the switching of the gate resistance is executed at the time of Vce=Vb which is the optimum point. With this control, it is possible to simultaneously realize a quick start-up of Vce at turn-off of IGBT and suppression of the surge voltage. Although the switching loss reduction effect depends on the setting of the surge voltage, the switching loss can be reduced by 20% to 50% compared to the methods of the related art. In the case of IGBT, the improved effect is particularly significant for a high-speed type, and the improved effect is relatively small for elements of low-speed type having a large tail current. In the case of a MOS-type element, because the element is fundamentally a high-speed type element, a significantly improved effect can be expected.

It is preferable that, after the surge occurring section is passed, the gate voltage be reduced in order to prevent erroneous operations. Thus, it is preferable that after the gate resistance is switched to a relatively large resistance, the gate resistance be again switched to a relatively small resistance to rapidly reduce the gate voltage. The time sequence for changing the gate resistance is small resistance→large resistance→small resistance.

<Turn-ON>

Figure 7:
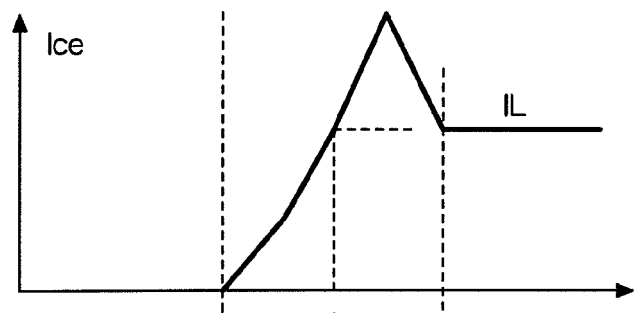
Figure 7:
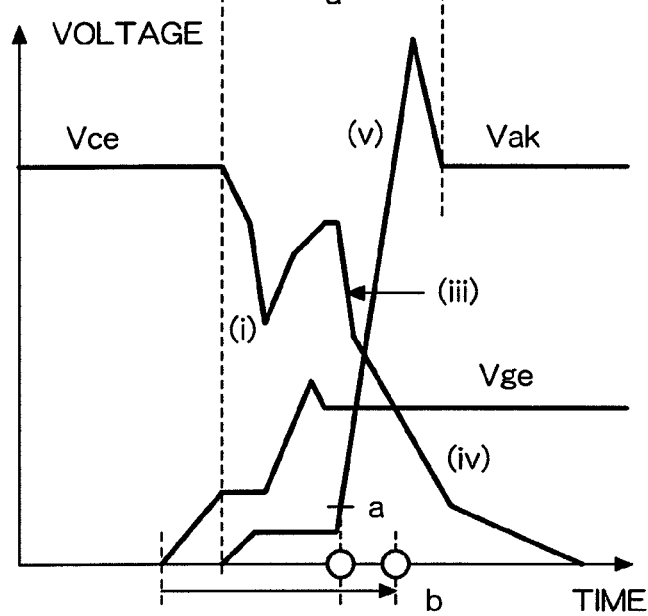

Next, turn-on during drive of an inductance load (L) using a MOSFET or IGBT as the semiconductor element for power (power semiconductor) will be described. FIG. 7 shows a waveform during turn-on. FIG. 7(a) shows a change with respect to time of an element current (recovery current) Ice and FIG. 7(b) shows a change with respect to time of an element voltage Vce. In the structure of FIG. 4, during turn-on of the element 10 to be driven, when a current starts to flow, Vce+Vak is initially reduced because of the influence of flow of current through a parasitic inductance of the circuit. At the initial stage, Vak remains at a low voltage. Therefore, a reduction of Vce voltage appears as shown in FIG. 7(b) with (i). Then, when the increase in the recovery current Ice passes a change point a, reduction in Vce+Vak due to the parasitic inductance of the circuit stops and Vce+Vak starts to increase. Then, when the recovery current Ice starts to decrease, Vce+Vak becomes greater than Vb (Vce+Vak>Vb). During this period, because Vak quickly starts up from a low voltage, Vce decreases as shown in FIG. 7(b) (iii) and reaches 0 as shown in FIG. 7(b) (iv). When the decreasing rate of the recovery current Ice is large and when the decreasing rate of Vce in (iv) is large, a large surge voltage occurs in Vak as shown in FIG. 7(b) with (v).

For portions of the recovery current Ice exceeding IL, because the current starts to flow when a reverse bias is applied to the element immediately before the point a of FIG. 7, the start-up of the reverse bias voltage Vak and the start-up of the recovery current are linked, and are both immediately before the point a. Therefore, by detecting the start-up of Vak with Vak=ΔV2 to detect the point a and switching the control when the decreasing time of the recovery current has elapsed regardless of the size of the surge voltage, it is possible to suppress the surge voltage at the surge portion and reduce switching loss by remaining Vce. Although the recovery current Ice has a high temperature dependency, the recovery current Ice attenuates within a predetermined time period. Therefore, it is also possible to determine, in advance, a recovery time from the start-up of Vak corresponding to the element characteristic, and switch the control. When the detection point is to be set using Vce, as shown in FIG. 7(b), because a plurality of points of the same voltage may be present for Vce with respect to time, there may be cases in which the detection point cannot be uniquely set. When, on the other hand, the detection point is set using Vak, because Vak monotonically increases after turn-on, the detection point can be uniquely set using the rising point. More specifically, a large gate resistance is used to inhibit occurrence of the surge voltage until the recovery current Ice passes the reduction time, and the gate resistance is then switched to a small gate resistance to quickly reduce the remaining Vce of the element, to reduce the switching loss.

When the control is to be switched in this manner, because the gate resistance is increased to realize suppression control of the surge voltage regardless of the size of the surge voltage, the switching loss reduction is not optimized when there is no occurrence of actual surge voltage. In the case of IGBT, it is known that a large surge voltage occurs when the element current is small and the surge voltage does not occur when the element current is large. Because of this, it is preferable to assume that surge voltage does not occur when the element current is large and to apply control to set a higher priority to reduction of the switching loss than the suppression of the surge voltage. When a large element current is applied to IGBT, the necessary gate voltage is increased, and consequently the time from the application of the gate voltage to the start-up of Vak is extended. Therefore, it is possible to take advantage of such a dependency, on the element current, of the time from the application of the gate voltage to the start-up of Vak, to assume that the element current is large and the surge voltage does not occur when the time from the application of the gate voltage to the start-up of Vak is longer than a threshold value, and to switch the gate resistance to the relatively small resistance at an earlier stage so that the control to suppress the surge voltage can be more quickly cancelled when the element current is large.

Figure 8:
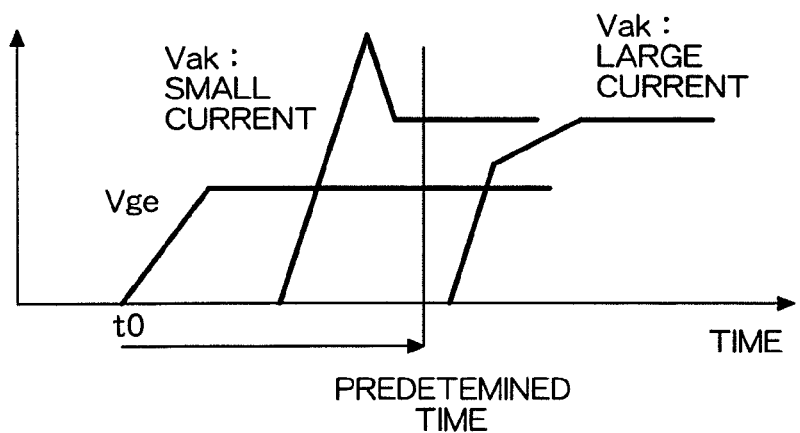
FIG. 8 is a diagram for explaining a change with respect to time of a gate voltage and Vak for each element current.

The operation and cancellation of the control to suppress the surge voltage based on the size of the element current will now be described in more detail. FIG. 8 shows a change with respect to time from the application of the gate voltage Vge during turn-on to the start-up of Vak, with the size of the element current as a parameter. With a time t0 when the gate voltage Vge reaches a predetermined voltage ΔV3 (time of application of the gate voltage Vge) as a starting point, a detected start-up time of Vak is compared with a predetermined time until start-up of Vak at a certain element current which is set in advance. When the detected time is shorter than the predetermined time which is set in advance, it is assumed that the element current is small and that surge voltage will occur. When the detected time is longer than the predetermined time which is set in advance, it is assumed that the element current is large and the surge voltage will not occur. When it is assumed that the element current is small and the surge voltage occurs, the suppression control for the surge voltage is performed, and when it is assumed that the element current is large and the surge voltage does not occur, the suppression control of the surge voltage is cancelled.

A method in which a time when Vak=ΔV2 is set as the detection point, a recovery time from the time when Vak starts up corresponding to the element characteristic is set in advance, and the control is switched when the recovery current passes a reduction time, and a method in which the control is switched according to the length of time from start-up of Vge to start-up of Vak have been described. These two methods can be executed simultaneously. In this case, when the time from the start-up of Vge to the start-up of Vak is short and the element current is small, the switching control of the gate resistance is executed according to a control based on Vak=ΔV2 and the suppression control for the surge voltage is carried out. When, on the other hand, the time from the start-up of Vge to the start-up of Vak is long and the element current is large, the suppression control for the surge voltage is cancelled and the control of the switching loss reduction is executed at an earlier stage. When it is known in advance that the element current is large, it is possible to cancel the suppression control for the surge voltage without waiting for the start-up of Vak after a predetermined time has elapsed from the start-up of Vge, and to transition to the control to reduce the switching loss.

Control during turn-on will now be described in detail with reference to FIG. 4. In the structure of FIG. 4, the upper-side element driving circuit and the lower-side element driving circuit have different structures, and when Vak of the lower-side element is detected by the upper-side element driving circuit, Vak can be easily detected by a voltage dividing circuit having a capacitor and a resistor.

The element voltage Vak which is voltage-divided is compared with a reference voltage ΔV2 by the comparator 26. In a hybrid vehicle driven with 650 V, ΔV2=100 V to 150 V, and the start-up is detected around Vak=100 V to 150 V. The comparator 26 supplies a detection signal to the controlling circuit 24. The controlling circuit 24 switches the control approximately 100 ns to 150 ns, which is a predetermined time set according to the element characteristic, after the start-up. In other words, the gate resistance is switched from a large resistance to a small resistance. A relatively large resistance R1 and a relatively small resistance R2 are connected to the gate of the element 10 to be driven. At the initial stage, only the resistance R1 is connected, and then both the resistor R1 and the resistor R2 are connected to the gate to achieve a relatively small resistance. If the gate resistance is large during turn-on of IGBT, the surge voltage is small and the turn-on loss is large. Because of this, although the loss from the turn-on of the IGBT to the completion of recovery is increased, the surge voltage can be inhibited. Then, with the small gate resistance, Vce of the IGBT is quickly reduced and the switching loss during turn-on is reduced.

Figure 9:
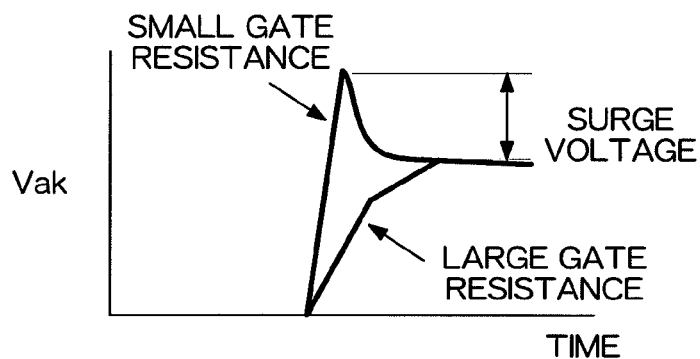
Figure 10:
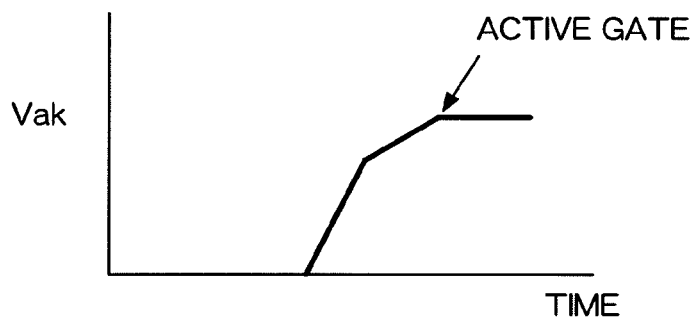
Figure 11:
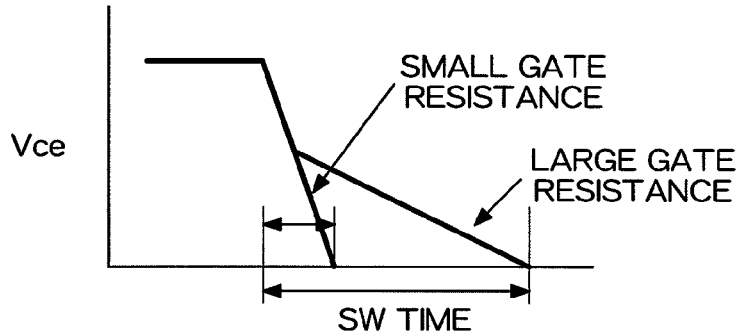
Figure 12:
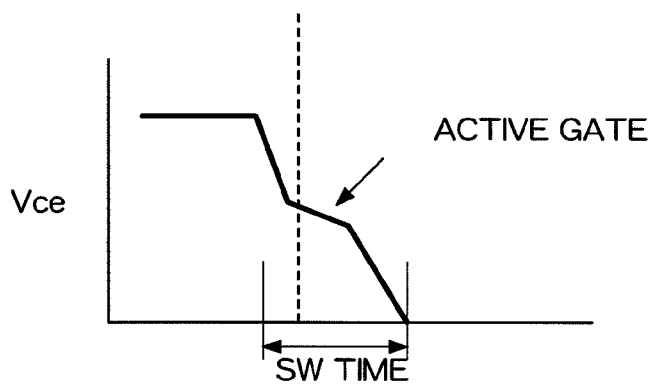

FIGS. 9-12 show changes in waveform during turn-on. FIGS. 9 and 11 respectively show changes with respect to time of Vak and Vce when the gate resistance is fixed to a relatively small resistance and when the gate resistance is fixed to a relatively large resistance. FIGS. 10 and 12 respectively show changes with respect to time of Vak and Vce when an active gate as in the present embodiment is employed, in which the gate resistance is switched from a relatively large resistance to a relatively small resistance. In FIG. 9, if the gate resistance is small, the surge voltage occurs, causing degradation or breakdown of the element. If the gate resistance is large in FIG. 11, although the surge voltage can be inhibited, the switching time is extended and the switching loss is increased. With the use of the active gate as shown in FIGS. 10 and 12, on the other hand, it is possible to reduce the switching loss while suppressing the surge voltage.

The controlling circuit 24 detects a rise time by comparing the start-up of the gate voltage Vge of the element 10 to be driven with a predetermined voltage value ΔV3 which is set in advance. Here, ΔV3 is, for example, about 4 V to 6 V. After a predetermined time has elapsed from the rise time of Vge, the gate resistance is switched from a relatively large resistance to a relatively small resistance even if the start-up of Vak is not detected. The predetermined time is, for example, within a range of 400 ns to 1 μs. With this configuration, when the start-up of Vak is slow and the element current is large, the element is driven with a small gate resistance before the start-up of Vak, and the switching loss can be reduced. Although the reduction effect of the switching loss depends on the setting conditions of the surge voltage or the like, the ON loss can be reduced by 20% to 50% compared to a structure driven with the methods of the related art.

A preferred embodiment of the present invention has been described. The present invention, however, is not limited to the preferred embodiment, and other configurations may be employed.

Figure 13:
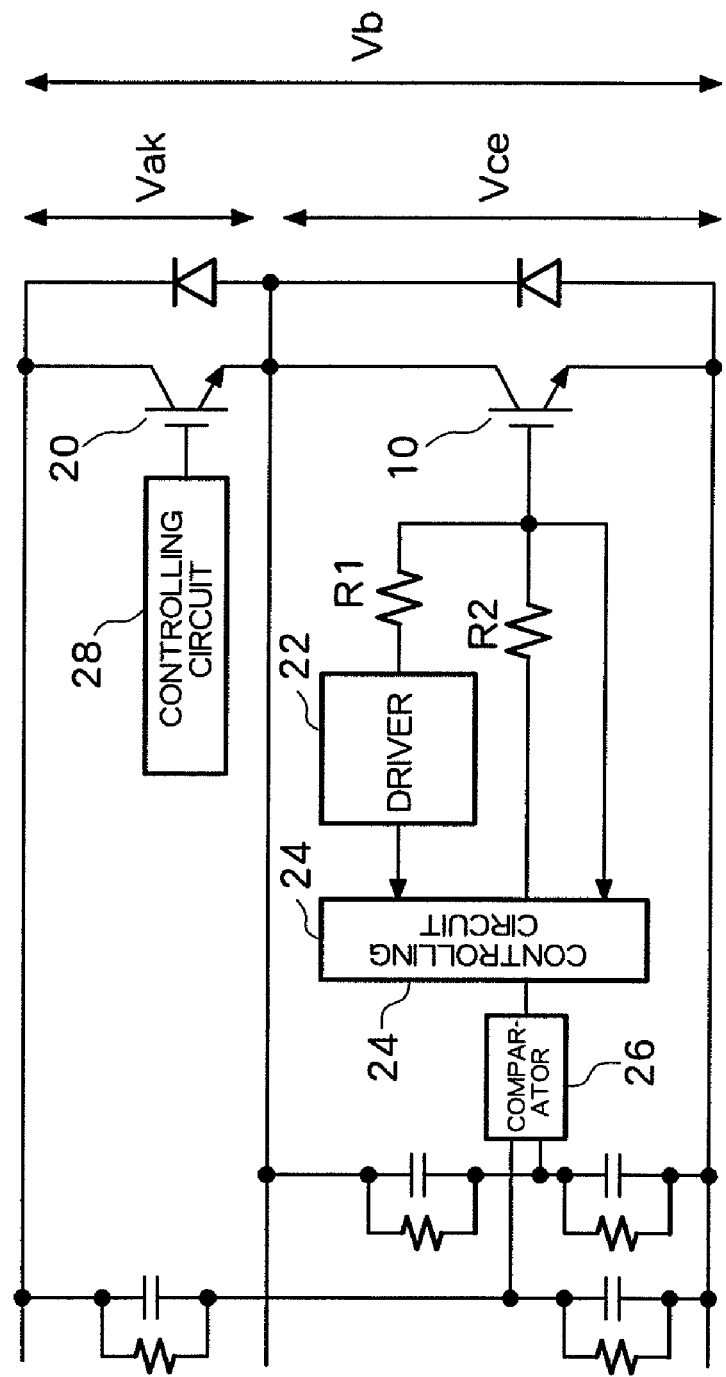
FIG. 13 is a circuit structure diagram when a lower-side element is driven.

For example, in the preferred embodiment, in a circuit having the upper-side element driving circuit and the lower-side element driving circuit as shown in FIG. 4, the element in the upper side is driven as the element 10 to be driven, but alternatively, it is also possible to drive an element on the lower side as the element 10 to be driven as shown in FIG. 13. In this case, because the ground line of the lower side is common with the ground line of the gate driving circuit, the drive voltage Vb and the element voltage Vce are divided with the same voltage dividing ratio and to be a maximum of 5 V, in order to detect Vak of the upper-side element. During turn-on of the IGBT, the difference of voltage-divided signals of Vb and Vce are compared with a reference voltage by the comparator 26, and Vak=Vb−Vce=150 V is detected. During turn-off, Vak=150 V is detected, and then, when Vce reaches Vb within 30 ns to 50 ns, the gate resistance is switched.

In the preferred embodiment, IGBT of Si is used as the power semiconductor, but alternatively, a MOSFET may be used or IGBT, MOSFET, HEMT, etc. using materials such as SiC and GaN may be used.

In the preferred embodiment, a voltage dividing circuit comprising a capacitor and a resistor is used as the detecting circuit of Vak, but alternatively it is also possible to detect Vak using a high voltage tolerance IC and supply the detection signal to the controlling circuit 24.

In the preferred embodiment, an active gate is realized by switching the gate resistance, but alternatively a semiconductor element may be used in place of the gate resistance or the gate resistance may be switched by switching the gate voltage of the semiconductor element or switching the resistance of the semiconductor element. In addition, a configuration in which the voltage of the gate driving circuit is changed and the voltage applied to the gate resistance is changed has the same advantage as switching the gate resistance at the same voltage. Moreover, because the gate voltage is determined based on a relationship between the gate resistance and the input capacitance of the gate, it is also possible to employ a configuration in which switching is realized by adding an external capacitance in place of switching the gate resistance. In other words, at least one of the gate resistance, the gate voltage, and the input capacitance of the gate may be controlled in a switching manner. Alternatively, these switching schemes may be combined such as switching the gate resistance and the gate voltage or switching the gate voltage and the input capacitance.

The invention claimed is:

1. A driving circuit of a semiconductor element for power, comprising a second semiconductor element which is connected in series with and forms a pair with a first semiconductor element which is to be driven, wherein the first semiconductor element and the second semiconductor element are driven by supplying a power supply voltage Vb to the first semiconductor element and the second semiconductor element, the driving circuit comprising:

a controlling circuit which controls, in a switching manner, at least one of a gate resistance, an applied voltage on a gate, and a gate input capacitance of the first semiconductor element during an OFF operation of the first semiconductor element; and a detecting circuit which detects a voltage Vak of the second semiconductor element, wherein the controlling circuit controls, in a switching manner, at least one of the gate resistance, the applied voltage on the gate, and the gate input capacitance at a point in time when a first predetermined time has elapsed from a time when the voltage Vak detected by the detecting circuit reaches a first predetermined voltage ΔV1.

2. The driving circuit of semiconductor element for power according to claim 1, wherein
the first predetermined time is a time period for an element voltage Vce of the first semiconductor element to reach the voltage Vb, and
the controlling circuit controls, in a switching manner, at least one of the gate resistance, the applied voltage on the gate, and the gate input capacitance when the voltage Vce reaches the voltage Vb.

3. The driving circuit of semiconductor element for power according to claim 1, wherein
the controlling circuit controls, in a switching manner, the gate resistance from a relatively small resistance to a relatively large resistance at the point in time when the first predetermined time has elapsed from the time when the voltage Vak detected by the detecting circuit reaches the first predetermined voltage ΔV1.

4. A driving circuit of a semiconductor element for power, comprising a second semiconductor element which is connected in series with and forms a pair with a first semiconductor element which is to be driven, wherein the first semiconductor element and the second semiconductor element are driven by supplying a power supply voltage Vb to the first semiconductor element and the second semiconductor element, the driving circuit comprising:
a controlling circuit which controls, in a switching manner, at least one of a gate resistance, an applied voltage on a gate, and a gate input capacitance of the first semiconductor element during an ON operation of the first semiconductor element; and
a detecting circuit which detects a voltage Vak of the second semiconductor element, wherein
the controlling circuit controls, in a switching manner, at least one of the gate resistance, the applied voltage on the gate, and the gate input capacitance at a point in time when a first predetermined time has elapsed from a time when the voltage Vak detected by the detecting circuit reaches a first second predetermined voltage ΔV2.

5. The driving circuit of semiconductor element for power according to claim 4, wherein
the first predetermined time is a time period until a recovery current of the second semiconductor element passes a peak, and
the controlling circuit controls, in a switching manner, at least one of the gate resistance, the applied voltage on the gate, and the gate input capacitance at the time when the recovery current passes the peak.

6. The driving circuit of semiconductor element for power according to claim 4, wherein
the controlling circuit controls, in a switching manner, the gate resistance from a relatively large resistance to a relatively small resistance at the point in time when the first predetermined time has elapsed from the time when the voltage Vak detected by the detecting circuit reaches the first predetermined voltage ΔV2.

7. The driving circuit of semiconductor element for power according to claim 4, further comprising:
a second detecting circuit which detects a gate voltage during the ON operation of the first semiconductor element, wherein
the controlling circuit controls, in a switching manner, at least one of the gate resistance, the applied voltage on the gate, and the gate input capacitance at a point in time when a second predetermined time has elapsed from a time when the detected gate voltage reaches a voltage which is greater than or equal to a second predetermined voltage ΔV3 which is less than or equal to a threshold voltage.

8. The driving circuit of semiconductor element for power according to claim 4, wherein
the controlling circuit controls, in a switching manner, the at least one of the gate Resistance, the applied voltage on the gate, and the gate input capacitance of the first semiconductor element after the first predetermined time has elapsed when an element current of the first semiconductor is smaller than a reference current value, and controls, in a switching manner, the at least one of the gate resistance, the applied voltage on the gate, and the gate input capacitance of the first semiconductor element in a time period before the first predetermined time has elapsed when the element current of the first semiconductor element is greater than the reference current value.

9. A driving circuit of a semiconductor element for power, comprising a second semiconductor element which is connected in series with and forms a pair with a first semiconductor element which is to be driven, wherein the first semiconductor element and the second semiconductor element are driven by supplying a power supply voltage Vb to the first semiconductor element and the second semiconductor element, the driving circuit comprising:
a controlling circuit which controls, in a switching manner, at least one of a gate resistance, an applied voltage on a gate, and a gate input capacitance of the first semiconductor element during an OFF operation and during an ON operation of the first semiconductor element; and
a detecting circuit which detects a voltage Vak of the second semiconductor element, wherein
the controlling circuit controls, in a switching manner, at least one of the gate resistance, the applied voltage on the gate, and the gate input capacitance during the OFF operation at a point in time when a first predetermined time has elapsed, from a time when the voltage Vak detected by the detecting circuit reaches a first predetermined voltage ΔV1, and controls, in a switching manner, at least one of the gate resistance, the applied voltage on the gate, and the gate input capacitance during the ON operation at a point in time when a second predetermined time has elapsed from a time when the voltage Vak detected by the detecting circuit reaches a second predetermined voltage ΔV2.

* * * * *